(12) United States Patent
Huo

(10) Patent No.: US 11,316,100 B2
(45) Date of Patent: Apr. 26, 2022

(54) HYBRID PERPENDICULAR AND IN-PLANE STT-MRAM

(71) Applicant: Suguo Huo, New Malden (GB)

(72) Inventor: Suguo Huo, New Malden (GB)

(*) Notice: Subject to any disclaimer, the term of this patent is extended or adjusted under 35 U.S.C. 154(b) by 85 days.

(21) Appl. No.: 17/066,465

(22) Filed: Oct. 8, 2020

(65) Prior Publication Data

US 2021/0111337 A1  Apr. 15, 2021

(30) Foreign Application Priority Data

Oct. 9, 2019 (GB) ...................................... 1914633

(51) Int. Cl.
| | |
|---|---|
| *H01L 43/08* | (2006.01) |
| *G11C 11/16* | (2006.01) |
| *H01L 43/02* | (2006.01) |
| *H01L 43/10* | (2006.01) |
| *G01R 33/09* | (2006.01) |
| *H01L 27/22* | (2006.01) |

(52) U.S. Cl.
CPC ............ *H01L 43/08* (2013.01); *G01R 33/093* (2013.01); *G01R 33/098* (2013.01); *G11C 11/161* (2013.01); *H01L 27/228* (2013.01); *H01L 43/02* (2013.01); *H01L 43/10* (2013.01)

(58) Field of Classification Search
None
See application file for complete search history.

(56) References Cited

U.S. PATENT DOCUMENTS

2020/0185595 A1* 6/2020 Le ...................... H01F 10/3268

FOREIGN PATENT DOCUMENTS

JP  WO 2017/169291  * 10/2017  ......... H01L 21/8246

\* cited by examiner

*Primary Examiner* — Tan T. Nguyen
(74) *Attorney, Agent, or Firm* — Chun-Ming Shih; Lanway IPR Services

(57) ABSTRACT

A memory device, comprising a first magnetic anisotropy magnetic tunnel junction (ma-MTJ) having a first free layer disposed at one end thereof and a second ma-MTJ having a second free layer disposed at one end thereof. The first and second ma-MTJs are stacked with each other with the first free layer facing the second free layer. A tunneling barrier is sandwiched between the first and second free layer. A magnetic anisotropy direction of the first ma-MTJ is perpendicular to a magnetic anisotropy direction of the second ma-MTJ, and a magnetisation direction of the first free layer is perpendicular to a magnetisation direction of the second free layer.

20 Claims, 9 Drawing Sheets

300

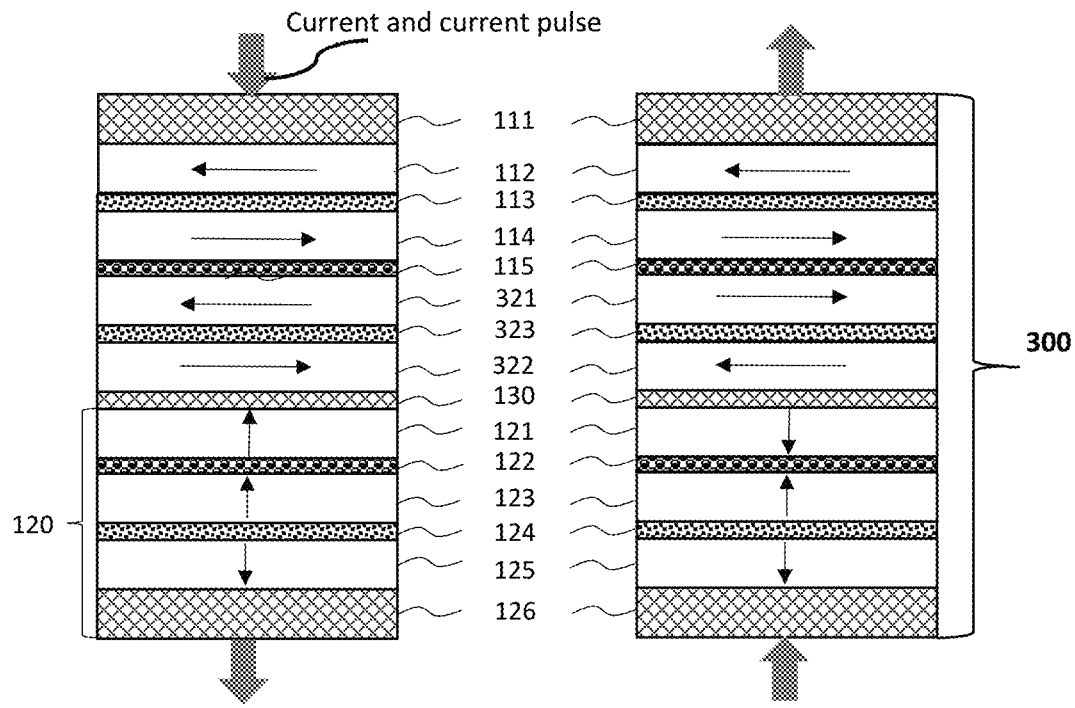
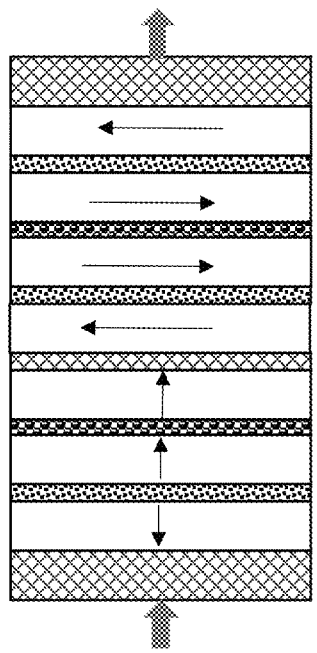
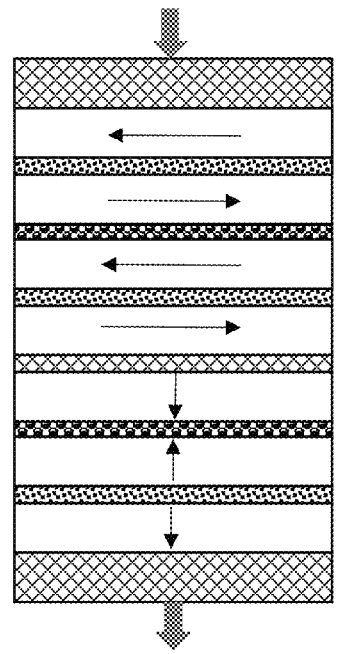
Fig. 5(a)   Fig. 5(b)
Fig. 5(c)   Fig. 5(d)

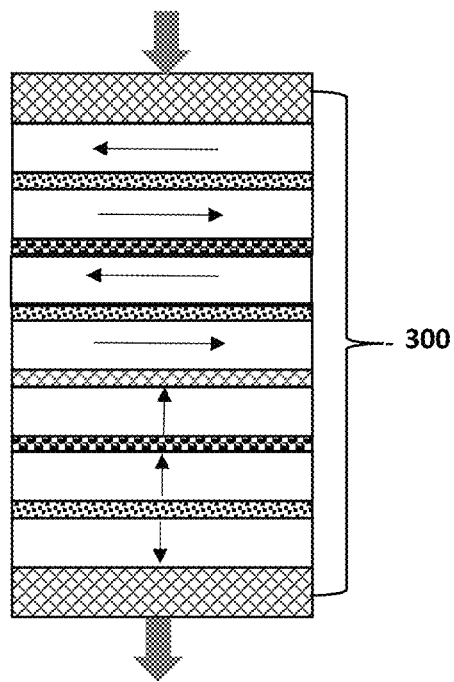
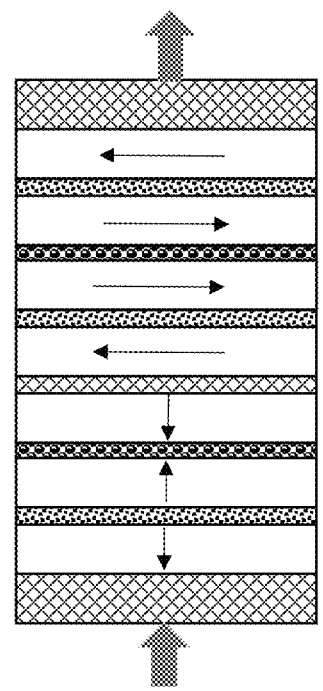
Fig. 6(a)     Fig. 6(b)
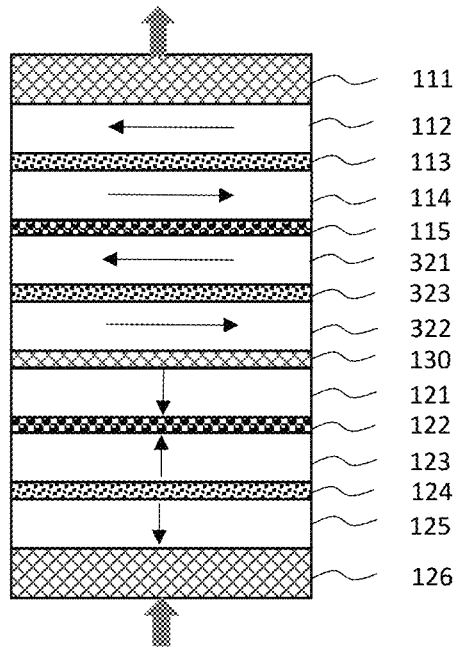
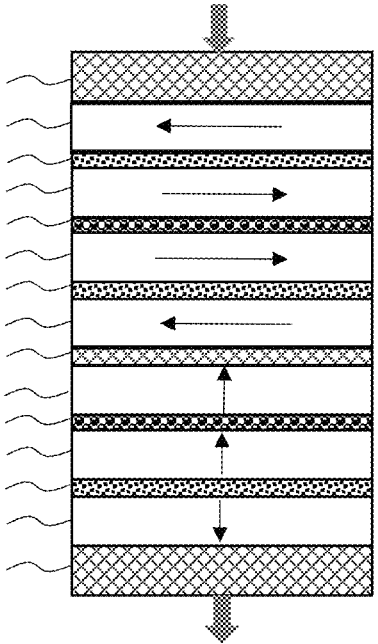
Fig. 6(c)     Fig. 6(d)

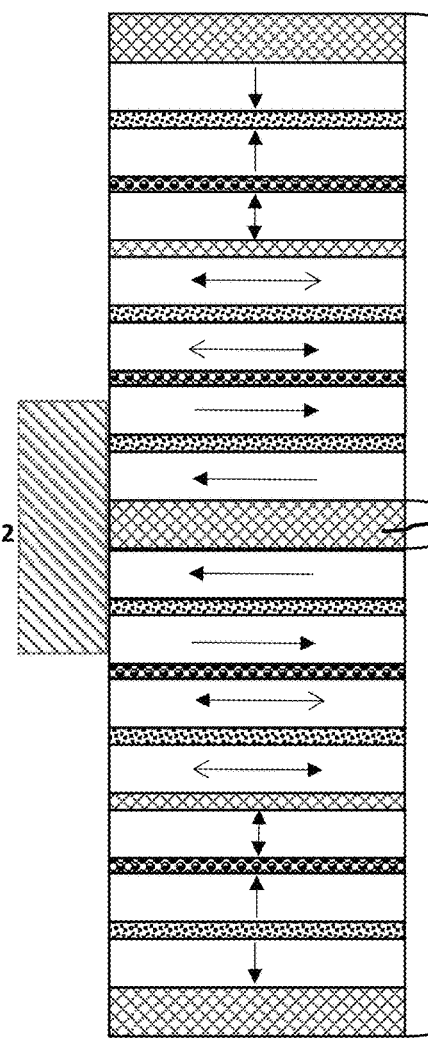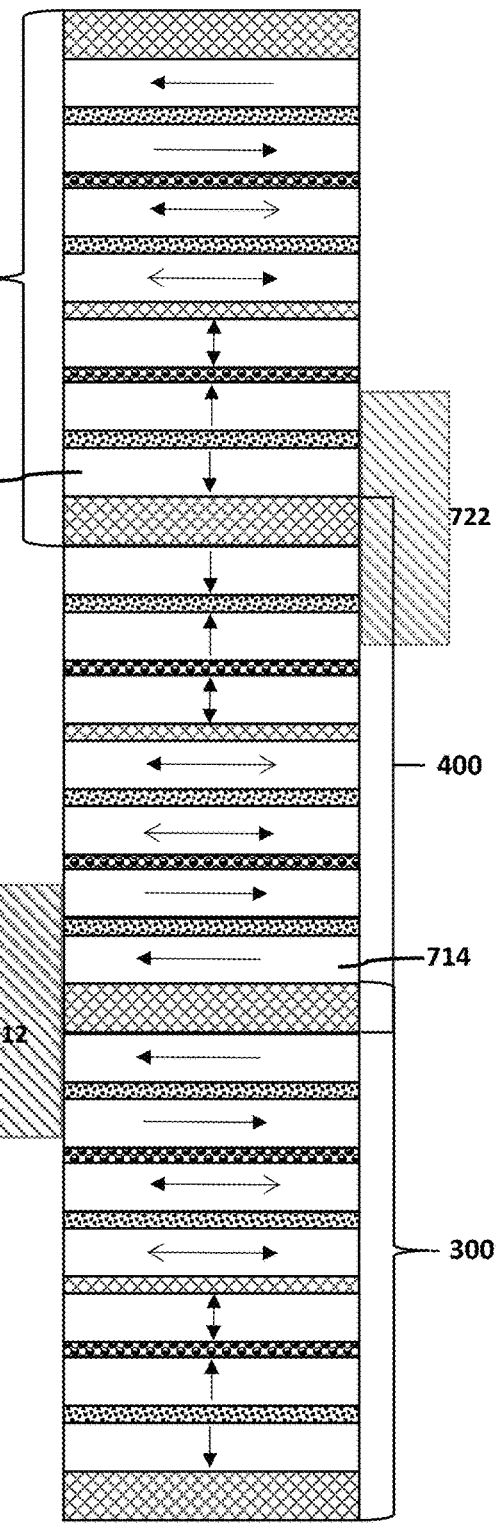
Fig. 7(a)
Fig. 7(b)

HYBRID PERPENDICULAR AND IN-PLANE STT-MRAM

CROSS REFERENCE

This application claims the benefit of Great Britain Patent No. GB 1914633.1 filed Oct. 9, 2019, which is hereby incorporated by reference herein in its entirety.

TECHNICAL FIELD

This disclosure relates to data storage, and more particularly, to a memory structure.

BACKGROUND

With the advent of high performance computing and mobile devices, enormous information is generated and needs to be stored that has pushed the rapidly growth in storage and memory technologies by shrinking the size of storage cell and memory cell. While the conventional semiconductor devices using electron charge property have been well developed and reached their limit, the emerging new technique of spintronics devices employing and manipulating electron spin property have been intensively researched in last decade with the discovery of GMR in 1998 leading Nobel prize in physics in 2004.

Dynamic random access memory (DRAM) using electron charge capacity has reached its limitations in maintaining a significant growth to meet the requirement of data storage. With the size shrink of the DRAM cell, the charge leakage causes an increase power consumption and other issues. In contrast with the electron charge-based DRAM, the electron spin-based magnetic random access memory (MRAM) is a non-volatile memory that would not consume much power and is considered as a good candidate to replace the semiconductor charge-based memory technology. Two kinds of MRAMs have been developed and they are magnetic field based MRAM and Spin Torque Transfer MRAM (STT-MRAM). Compared with the magnetic field driven MRAM, the STT-MRAMs have found their place in niche products due to their small power consumption, process simplified and cell miniature.

A typical STT-MRAM device is basically a magnetic tunnel junction (MTJ) stack composed of two magnetic layers separated by a MgO barrier where one of the magnetic layers is called reference layer (RL) whose magnetisations are fixed in one direction and the other one is called free layer (FL) whose magnetisations can be rotated to be parallel or antiparallel to the RL magnetisations by spin transfer torques after passing currents through the MTJ from either RL through MgO barrier to FL or FL through MgO barrier to RL, respectively, to complete the information storage writing. The information stored in the FL layer can be read out after passing a current through the MTJ stack and the maximum resistance or the minimum resistance is obtained, respectively, if the FL magnetisation is stored antiparallel or parallel to the RL magnetisation based on tunneling magneto-resistance (TMR) effect.

There are two kinds of STT-MRAM devices, an in-plane STT-MRAM where the magnetisations in both FL and RL are along their planes and a perpendicular STT-MRAM where the magnetisations in FL and RL are perpendicular to their planes. Like any storage, a STT-MRAM device also needs to have three functions of writing, bit detain and reading. In a STT-MRAM, Spin Transfer Torque is employed to write the bit in the free layer (FL), the bit stored in the free layer is maintained for a long time, such as 10 years, and then the TMR effect, like in a TMR reader, is used to read out the information stored in the free layer after passing the current through the device. The FL in a STT-MRAM device is different from that in a TMR reader because the FL in a STT-MRAM is more or less like the hard disc drives (HDDs) media that will require FL has the recording media property of strong magnetic anisotropy to maintain the information stored for a long time. Therefore, the FL in a STT-MRAM device must have balanced properties. That is, to be written in the bit with a Spine Transfer Torque, the magnetic anisotropy cannot be too strong; and to maintain the bit written for a long time, the magnetic anisotropy cannot too weak. So far, the preferred FL magnetic material is CoFe alloy because of its good spintronics effect that is required in spin torque transfer writing and a good TMR reading. The CoFe alloy is a typical soft ferromagnetic material that presents a big challenge for bit storage stability and limits the memory cell miniature because a large cell is more stable and less boundary effects, typical issues in an in-plane STT-MRAM.

A perpendicular STT-MRAM device has been proposed resolve the memory stability issue in an in-plane STT-MRAM device because of a strong perpendicular anisotropy. CoFe alloy is still a prepared spintronics materials of perpendicular magnetic anisotropy films. A CoFe alloy film of less than 1.5 nm thick will have a perpendicular anisotropy, which is much stronger than its in-plane anisotropy in a film thicker than 1.5 nm. This can solve the FL bit memory stability issue and also allow cell further miniature to increase the areal storage density. However, as mentioned before, a strong anisotropy in FL memory will require a large STT to write bit information in a FL cell. A slightly tilted anisotropy from perpendicular direction in a perpendicular STT-MRAM device was proposed to reduce the requirements of writing STT. The perpendicular STT-MRAM process and process control are also much complicated compared with its counterpart of in-plane STT-MRAM and also its FL memory can only store one-bit information of "0" and "1". Recently, a polarise magnetic layer having in-plane magnetic anisotropy is used to produce an additional spin transfer torque, perpendicular to the normal STT, on the FL of the perpendicular STT-MRAM through a nonmagnetic space disposed between the polarised magnetic layer and the MTJ free layer to promote the free layer writing performance.

Generally, the single bit, "0" or "1," is used in a spin-based SST-MRAM, which a disadvantage compared with a semiconductor charge-based DRAM. A high-bit perpendicular STT-MRAM using multiple of free layers by gradually switching individual FL starting from the layer adjacent to the MgO barrier has been proposed. However, this process is very difficult to control and easy to have errors.

SUMMARY

A hybrid STT-MRAM memory device is provided. The memory device comprises a first magnetic anisotropy magnetic tunnel junction (ma-MTJ) having a first free layer disposed at one end thereof and a second ma-MTJ having a second free layer disposed at one end thereof. The first and second ma-MTJs are stacked with each other with the first free layer facing the second free layer. A tunneling barrier is sandwiched between the first and second free layer. A magnetic anisotropy direction of the first ma-MTJ is perpendicular to a magnetic anisotropy direction of the second ma-MTJ, and a magnetisation direction of the first free layer is perpendicular to a magnetisation direction of the second free layer.

The first free layer and the second free layer may be immediately adjacent to the two opposite sides of the tunneling barrier layer. The first tunneling barrier layer may include tunneling magneto-resistant material, such as least MgO, AlO, TiO, or another dielectric material. In one embodiment, first tunneling barrier layer includes a Cu layer.

In one embodiment, each of the first and the second ma-MTJs may further comprises a tunneling barrier; a reference layer; a metallic spacer of Ru layer; a pinned layer; and an antiferromagnetic pinning layer, arranged in sequence from the first and the second free layer, respectively. The reference stack, comprising from the reference layer to the antiferromagnetic pinning layer, of the second ma-MTJ may further comprise one of a permanent perpendicular magnetic anisotropy (pma) magnetic layer comprising hcp(002) Co alloy or L10 alloy; an synthetic antiferromagnetic stack comprising two permanent perpendicular magnetic anisotropy layers separated from each other by a metallic spacer of Ru layer.

The first ma-MTJ may include a first in-plane ma-MTJ (ima-MTJ) and the second ma-MTJ includes a first perpendicular ma-MTJ (pma-MTJ). The first ima-MTJ may further comprise a metallic spacer of Ru layer and a third free layer arranged in sequence between the first free layer and the first tunneling barrier layer. The first ima-MTJ, the first tunneling barrier layer, and the first pma-MTJ are arranged in a top-down sequence.

Alternatively, the pma-MTJ, the tunneling barrier layer, and the ima-MTJ may be arranged in a top-down sequence. The memory device may further comprise a second ima-MTJ; a second tunneling barrier layer; and a second pma MTJ arranged in a top-down sequence from the first ima-MTJ. The first ima-MTJ and the second ima-MTJ may share a common antiferromagnetic pinning layer therebetween. The second ima-MTJ may comprise a fourth free layer, a metallic spacer of Ru layer, and a fifth free layer arranged in a top-down sequence between the common antiferromagnetic pinning layer and the second pma-MTJ. The second pma-MTJ may comprise a sixth free layer immediately adjacent to the second tunneling barrier layer. The memory device may further comprising a first contact at a side surface of the memory device and maximumly extending from a reference of the first ima-MTJ and a reference layer of the second ima-MTJ.

In another embodiment, the memory device may further comprise a third ima-MTJ, a third tunneling barrier layer, and a third pma-TMJ arranged in a top-down sequence on top of the first pma-MTJ. The third ima-MTJ may comprise a seventh free layer, a metallic spacer of Ru layer, and an eighth free layer arranged in sequence on top of the third tunneling barrier layer. The third pma-MTJ may comprise a ninth free layer immediately adjacent to the third tunneling barrier layer and the third pma-MTJ and the first pma-MTJ shares a common antiferromagnetic pinning layer. The memory device may further comprise a second contact at a side surface of the memory device and the second contact extends from a reference layer of the third pma MTJ and a reference layer of the first pma MTJ.

In yet another embodiment, the memory device may further comprise a fourth pma-MTJ, a fourth tunneling barrier layer, and a fourth ima-TMJ arranged in a top-down sequence under the second pma-MTJ on top of the third ima-MTJ. The fourth pma-MTJ comprises a tenth free layer immediately adjacent to the fourth tunneling barrier layer; the fourth ima-MTJ comprises an eleventh free layer, a metallic spacer of Ru layer, and a twelfth free layer arranged in a top-down sequence under the fourth tunneling barrier layer; and a third contact electrode at the side surface of the memory device and extends from a reference layer of the fourth ima-MTJ to a reference layer of a third ima-MTJ, and the third and fourth ima-MTJ share a common antiferromagnetic layer.

BRIEF DESCRIPTION OF DRAWINGS

FIG. 1($c$) and FIG. 1($d$) shows two schematic diagrams of two additional pma-MTJ structures in H-STT-MRAM;

FIG. 5($a$) to FIG. 5($d$) show schematic diagrams of cross-sectional views of the third embodiment of 2-bit H-STT-MRAM device using the two step writing method proposed to obtain the resistance state of $(R_{pma}^{min}+R_{ima}^{max})$, the resistance state of $(R_{pma}^{max}+R_{ima}^{min})$, the resistance state of $(R_{pma}^{min}+R_{ima}^{min})$ and the resistance state of $(R_{pma}^{max}+R_{ima}^{max})$, respectively, supposed that the ima-MTJ stack is relatively easy written compared with the pma-MTJ stack;

FIG. 6($a$) to FIG. 6($d$) show schematic diagrams of cross-sectional views of the third embodiment of 2-bit H-STT-MRAM device where the cross-section is taken perpendicular to the device substrate using the two step writing method proposed to obtain the resistance state of $(R_{pma}^{min}+R_{ima}^{max})$, the resistance state of $(R_{pma}^{max}+R_{ima}^{min})$, the resistance stat of $(R_{pma}^{max}+R_{ima}^{max})$ and the resistance state of $(R_{pma}^{min}+R_{ima}^{min})$, respectively, supposed that the pma-MTJ stack is relatively easy written compared with the ima-MTJ stack.

DETAILED DESCRIPTIONS

Figure 1A:
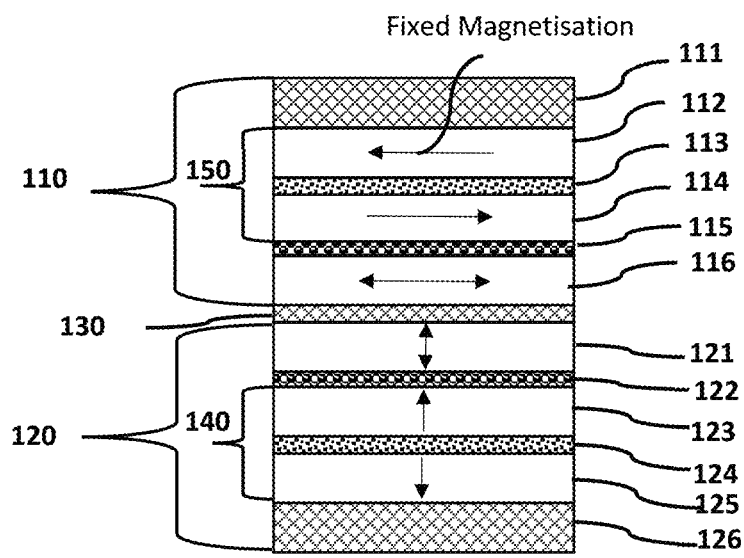
FIG. 1($a$) and FIG. 1($b$) are schematic diagrams of a cross-sectional view, taken from the middle of the cell and perpendicular to the device substrate surface, and a top or a bottom view of the first embodiment of H-STT-MRAM, respectively.

Currently, the STT-MRAM has been in the mass production stage in manufacture to replace the DRAM in products such as computers and mobile devices. However, the STT-MRAM still suffers from the issues caused by memory cell miniature limitation. For example, an in-plane magnetic anisotropy STT-MRAM of a cell size less than 60 nm suffers from instability and uniformity issues of FL magnetisation that limit the increase of storage area density and make it difficult to compete with the DRAM devices. The perpendicular magnetic anisotropy STT-MRAM may overcome the memory size miniature issue in the in-plane STT-MRAM device, but still have two disadvantages compared to a semiconductor DRAM. The first is that one perpendicular STT-MRAM memory cell is only a 1-bit storage having two resistance states of "0" and "1" while the semiconductor DRAM can store more bits. The second issue is that the electron spin transfer torque may not be strong enough to switch the FL magnetisations if the FL has a strong perpendicular magnetic anisotropy required for FL magnetisation stored for a long time.

To resolve the first issue, a simply stacking up of perpendicular STT-MRAM MTJs was proposed on the condition that MTJs have different magnetic properties, including different TMR and even different memory cell sizes that will render the MTJ stack optimisations and greatly increase the complexity of the process. Regarding the second issue, magnetic field assistant for STT was proposed by using an additional writing wire that may increase the power consumption, produce additional heat, and also have process complexity. A polarized magnetic layer with an in-plane magnetic anisotropy is used to create an additional STT on the FL in the pma-MTJ stack if one barring layer is put between the perpendicular magnetic anisotropy FL of the pma-MTJ and the in-plane magnetic anisotropy polarized layer. It has, however, not fully used the polarized magnetic layer and still has got the first issue of a 1-bit storage only.

In one embodiment, a hybrid STT-MRAM (H-STT-MRAM) that includes a face-to-face stacking of a perpendicular MTJ stack and an in-plane MTJ stack separated with each other by a nonmagnetic spacer is provided. The nonmagnetic spacer is disposed between a FL of the perpendicular MTJ and a FL of the in-plane MTJ. Compared with the current in-plane STT-MRAM or Perpendicular STT-MRAM, the proposed H-STT-MRAM device has a better free layer writing performance in both perpendicular MTJ (pma-MTJ) stack and in-plane MTJ (ima-MTJ) stack due to an additional spine transfer torque perpendicular to the normal STT through the nonmagnetic spacer on one free layer writing from the other free layer. Two adjacent free layers in the two MTJs are acting as electron polarising magnetic layers each other to assistant each free layer writing. The two adjacent free layers in the pma-MTJ stack and the ima-MTJ stack may be used for high-bit storage by using a two-step writing method disclosed to realize 2-bit storage in a H-STT-MRAM device, such as (00), (11), (01) and (10) where "1" and "0" represent maximum and minimum resistance in two MTJ stacks, respectively, to increase the storage capacity. A (synthetic antiferromagnetic) SAF free layer structure is proposed to replace the free layer in the ima-MTJ stack to increase the memory cell stability and reduce cell size.

The H-STT-MRAM device proposed is different from the Dual STT-MRAM (D-STT-MRAM) device that include two MJTs sharing one FL. In one configuration where two RLs in the two MTJs have a reversed fixed magnetisation, the FL have two same-sign spin transfer torques from the bottom RL and the top RL while in writing; however, a maximum and minimum resistance in the two MTJs will always be obtained in reading that will render the reading signal no less only a 1-bit storage in the D-STT-MRAM. The different resistance of two MTJs are proposed, but this would still render the TMR effect and cannot resolve the issue of the two MTJ TMR cancellation issue. One may design the D-STT-MRAM having parallel fixed magnetisation in the two RLs that can indeed obtain two maximum or minimum resistance state in two MTJs at the same time while reading, but two opposite sign spine transfer torques from the RL of the MTJ, below the shared FL, and the RL of the MTJ, above the shared FL, will be on the FL while writing leading writing power reduced issue. Therefore, the D-STT-MRAM device has no much room in application and the H-STT-MRAM device disclosed will be a good candidate in future high performance computing, mobile devices and information storages.

Several embodiments of H-STT-MRAM devices including a face-to-face stacking of an ima-MTJ stack and a pma-MTJ stack separated by a nonmagnetic spacer between two FLs of the two MTJs are proposed to resolve the above issues in the current STT-MRAM device. The Synthetic Antiferromagnetic (SAF) free layer structure including two magnetic layers separated by a Ru layer to make a strong antiferromagnetic coupling between the two magnetic layers is proposed to replace the single FL in the ima-MTJ and this SAF FL structure is a very stable magnetic structure having a close to zero demagnetisation effect and uniform magnetisation distributions even for a small memory cell.

In the H-STT-MRAM device, the in-plane magnetic anisotropy FL in the ima-MTJ stack and the perpendicular magnetic anisotropy FL in the pma-MTJ stack is separated by a nonmagnetic spacer that makes one FL automatically a polarisation magnetic layer of the other FL writing by supplying an additional spin transfer torque, perpendicular to the normal spin transfer torque from the RL, through the nonmagnetic space to assistant writing. Also, the different magnetic properties and TMRs of the ima-MTJ and the pma-MTJ in their optimisations makes the H-STT-MRAM device a 2-bit memory device. Based on the 2-bit H-STT-MRAM, high-bit H-STT-MRAM devices are also proposed. Hence, the proposed state of art H-STT-MRAM device can fix the current issues in STT-MRAM device and has excellent STT-MRAM superior properties, such as non-volatile, high-bit, better writing performance with an additional STT, high areal density, less power consumption, fast speed in reading and writing compare to a semiconductor charge-based DRAM device.

Figure 1B:
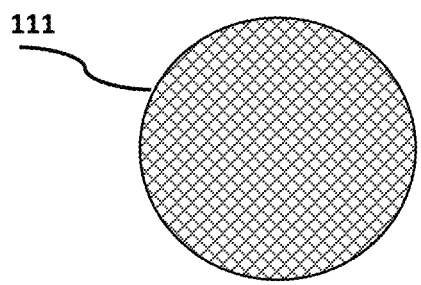

FIGS. 1(a) and 1(b) illustrate a cross-sectional view and a top (also a bottom) view of an H-STT-MRAM device 100, respectively. The H-STT-MRAM 100 includes a top-free-layer (T-FL) perpendicular magnetic anisotropy magnetic tunneling junction (pma-MTJ) 120 where a free layer 121 is a top layer of the pma-MTJ 120, a bottom-free-layer (B-FL) in-plane magnetic anisotropy magnetic tunneling junction (ima-MTJ) 110 where a free layer 116 is a bottom layer of the bottom of the ma-MTJ 1110, and a nonmagnetic spacer 130 between the ima-MJT 110 and the pma-MJT 120.

The T-FL pma-MTJ 120 includes a reference layer stack that includes a bottom AFM pinning layer 126, a perpendicular magnetic anisotropy SAF structure 140, a MgO tunneling barrier 122, and a perpendicular magnetic anisotropy free layer (FL) 121. The perpendicular magnetic anisotropy SAF structure 140 includes a pinned layer (PL) 125 and a reference layer (RL) 123 separated with each other by a Ru layer 124 to form an antiferromagnetic coupling between PL 125 and RL 123. The AFM pinning layer 126 may be used to perpendicularly pin the magnetisations in the pinned layer PL 125 and also to further increase the pinned field, which is a field to reverse the magnetisation of the PL 125.

The B-FL ima-MTJ 110 includes a reference layer stack, that includes a top AFM pinning layer 111 disposed on an SAF structure 150. The SAF structure includes a PL 112, which, in the embodiment as shown in FIG. 1(a), disposed immediately under the AFM pinning layer 111. The SAF structure 150 comprises the PL 112 and an RL 114 separated with each other by a Ru layer 113 to form an antiferromagnetic coupling between PL 112 and RL 114. The SAF structure 150 is disposed on an in-plane magnetic anisotropy FL 116. A MgO tunneling barrier 115 is sandwiched between the FL 116 and the SAF 150 of the B-FL ima-MJT 110. The SAF structure 150 pinned by the AFM 111 may be used as the RL stack and has a similar function as that SAF structure 140 pinned by AFM 126. In addition, it also forms a perfect zero demagnetisation structure for magnetically matching PL 112 and RL 113.

The nonmagnetic spacer 130 between the B-FL ima-MTJ 110 and the T-FL pma-MTJ 120, and specifically, between the FL 116 of the ima-MTJ 110 and the FL 121 of the pma-MTJ 110, may include TMR tunneling barrier materials such as MgO or AlO, or a GMR space of Cu, or a just barrier materials of Ta, Au, W, V, Mo, Ru, Cr or Nb to cut-off the exchange coupling of the two free layers in the T-FL pma-MTJ 120 and the B-FL ima-MTJ 110 and also to promote the polarise electron spin transport between its two adjacent free layers to promote FL writing.

In the H-STST MRAM 100, the double-sided arrows illustrated in of the FL 116 in the B-FL ima-MTJ 110 and the FL 121 in the T-FL pma-MTJ 120, respectively, indicate the magnetisations in the FL are not fixed and can be rotated by spin transfer torque (STT) or magnetic fields. The H-STT-MRAM 100 promotes the spin transfer torque (STT) writing in both MTJs by supplying an additional spin transfer torque on one free layer FL while its writing from the other MTJ free layer FL through the nonmagnetic spacer 130. After passing top-down writing currents and current pulses through the H-STT MRAM 100, in the T-FL pma-MTJ 120 writing, there is be a spin transfer torque from the RL 123 through the MgO tunneling barrier 122 to align the FL 121 magnetisations parallel to the magnetisation in the RL 123 as in the case of a normal STT-MRAM, and an additional spin transfer torque from the FL 116 of the B-FL ima-MTJ 110 through the nonmagnetic spacer 130 on the FL 121 to assistant its writing. This additional spin transfer torque from FL 116 is perpendicular to the normal spin transfer torque from the RL 123 throughout although the amplitude of this additional spin transfer torque from FL 116 will change with the magnetisation, similar to that of a normal spin transfer torque from RL 123. Different from the traditional assistant spin transfer torque from a polarisation magnetic layer, the FL 116 is used not only as an additional spin transfer torque source, but also as a storage cell in the ima-MTJ stack 110 and it is also beneficial to an additional spin transfer torque from FL 121 to assistant in its writing. Therefore, different from a FL in the traditional STT-MRAM or the traditional STT-MRAM having multiple MTJ stacks, the FL of one MTJ in the H-STT-MRAM has two functions of a memory cell under a normal STT from its RL and an additional STT from its adjacent FL of the other MTJ while its writing and an additional STT source of polarization magnetic layer on its adjacent FL of the other MTJ. The passing writing currents and current pulses through B-FL ima-MTJ 110 produces a spin transfer torque from the RL 114 through the MgO tunneling barrier 115 to rotate the FL 116 magnetisations antiparallel to those in RL 114 as in the case of a normal STT-MRAM, and also an additional spin transfer torque, perpendicular to the normal spine transfer torque, from the FL 121 of the T-FL pma-MTJ 120 through the nonmagnetic spacer 130 on the FL 116 magnetisations to assistant their rotation.

FIG. 1(b) shows a top (or a bottom) view of the H-STT-MRAM device 100 in a disc shape. In one embodiment, the H-STT-MRAM device memory cell has a cylinder shape although other shapes, such as an elliptical cylinder, a square cylinder or a rectangular cylinder or other columnar structure are also included.

The RL stack in the pma-MTJ stack 120 may also be a perpendicular anisotropy permanent magnetic film, such as hcp(002) Co alloy, L10 alloy, such as FePd, FePt or CoPt, or multilayers of Co2/Pd9 or Co2/Pt9 or a perpendicular anisotropy SAF formed by two perpendicular anisotropy permanent magnet films separated by a Ru layer.

Figure 1C:
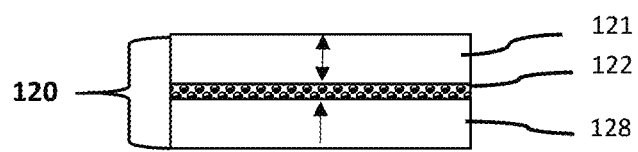

FIG. 1(c) shows the T-FL pma-MTJ 120 having a perpendicular anisotropy permanent magnetic film as a RL layer 128 to replace the SAF 140 pinned by AFM 126 in T-FL pma-MTJ 120.

Figure 1D:
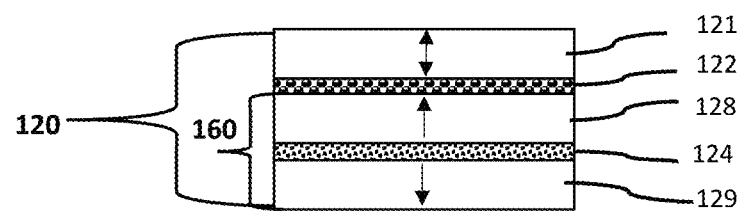

FIG. 1(d) shows a perpendicular anisotropy Permanent Magnet SAF (PM-SAF) structure 160 formed by two perpendicular anisotropy permanent magnet layers of RL 128 and PL 129 separated by a Ru layer 214 can be used to replace the single PM RL 120 In order to further increase the reversed magnetic field in the PM RL layer 128.

The free layers FL in pma-MTJ stack and ima-MTJ stack may include CoFe, CoFeB or other CoFe alloys, although the FL in pma-MTJ may be multilayers of CoFeB/Ta or CoFe alloy layers separated by nonmagnetic layers including Au, W, V, Mo, Ru, Cr or Nb to fully employ the perpendicular surface magnetic anisotropy in CoFeB layers for increasing TMR effect.

The AFM 111 in the ima-MTJ 110 and the AFM 126 in the pma-MTJ 120 may be IrMn, NiMn, FeMn, PtMn or IrMn/FeMn multilayers. For the case of a permanent magnet RL in a pma-MTJ stack, particularly for a permanent magnet RL of hcp(002) Co alloy, L10 alloy, such as FePd, FePt or CoPt, or multilayers of Co2/Pd9 or Co2/Pt9 or a perpendicular anisotropy SAF may only be formed by two perpendicular anisotropy permanent magnet films separated by a Ru layer. The perpendicular magnetic anisotropy RL and FL will need either to be deposited in a high temperature and under a perpendicularly align magnetic field or in the oven annealing under a perpendicular magnetic align field after done a normal temperature deposition. The perpendicular magnetic anisotropy FL and RL in a pma-MTJ can also be a multilayer of CoFeB separated by nonmagnetic space of Ta, Au, W, V, Mo, Ru, Cr or Nb and a high temperature annealing under a perpendicular align magnetic field during deposition or oven annealing under a perpendicular magnetic field after the normal temperature deposition will be likely needed to further improve their magnetic properties.

Figure 2:
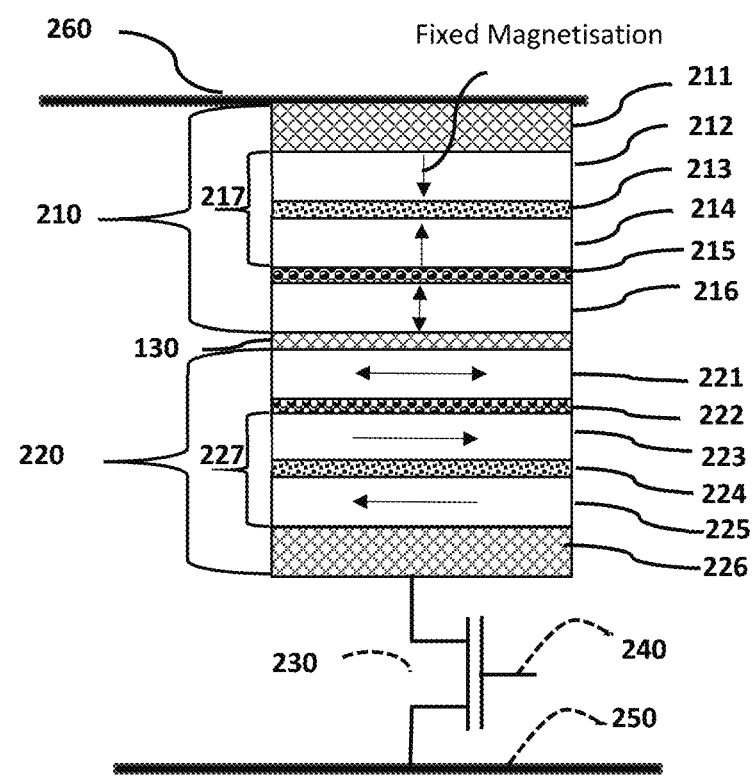
FIG. 2 is a schematic diagram of a cross-sectional view of the second embodiment of H-STT-MRAM device with a transistor, a word-line, a source line and a bit line, where the cross-section is taken from the middle of the cell and perpendicular to the device substrate surface.

FIG. 2 illustrates another embodiment of the H-STT-MRAM device 200 having two MTJs stacked in a reversed order compared to those of the H-STT-MRAM 100 in FIG. 1, while still keeping a face-to-face stacking of the ima-MTJ and a pma-MTJ. The H-STT-MRAM 200 includes a T-FL ima-MTJ stack 220 and a B-FL pma-MTJ 210 separated with each other by a nonmagnetic space 130 between the FL 216 of the B-FL pma-MTJ 210 and the FL 221 of the T-FL ima-MTJ stack 220. The B-FL pma-MTJ 210 includes a RL stack, which comprises a perpendicular magnetic anisotropy SAF 217 with a PL 212 and RL 214 separated by a Ru layer 213, pinned perpendicularly by a top AFM 211, a FL 216 below the RL stack, and a tunneling barrier 215, such as MgO, disposed between the FL 216 and the RL 214 of the SAF structure 217 pinned by the top AFM 211. The T-FL ima-MTJ stack 220 includes a RL stack that comprises an in-plane magnetic anisotropy SAF stack 227, which includes a PL 225 and RL 223 separated by a Ru layer 224 and pinned by a bottom AFM 226, a FL 221 above the RL stack, and a tunneling barrier 222, such as MgO, between the FL 221 and the RL 223.

The nonmagnetic barrier layer 130 is disposed between the FL 216 of the B-FL pma-MTJ 210 and the FL 221 of the T-FL ima-MTJ 220. As discussed in the first embodiment 100 of the H-STT-MRAM device, two FLs in 200 will also have a new function to induce an additional spin transfer torque each other, perpendicularly related to the normal spin transfer torque from its RL stack, through the nonmagnetic spacer 130 to assistant writing in addition to their memory function. FIG. 2 also shows a bottom transistor 230 used for signal amplification. The transistor 230 a source line 250, a word line 240, and a bit line 260 connected to a top electrode of the stack.

Both of the H-STT-MRAMs of 100 and 200 include an ima-MTJ having a single layer of FL that may limit the device cell miniature for high areal density storage due to its weak in-plane magnetic anisotropy, edge effects, and demagnetisation effects leading to a thermal instability and cell magnetisation distribution non-uniformity, which are typical issues for an in-plane STST-MRAM device. In one embodiment, a SAF free layer structure is proposed to replace the FL in the ima-MTJ cell. The SAF FL structure includes two ferromagnetic layers separated by a Ru layer to form a strong antiferromagnetic coupling structure having a nearly zero demagnetising field if the two ferromagnetic films have a matched magnetic properties and size. This strong antiferromagnetic coupling SAF free layer structure may resolve the size miniature limitation of about 60 nm for the single-FL structure and allows a size down to sub-10 nm for high areal storage.

Figure 3A:
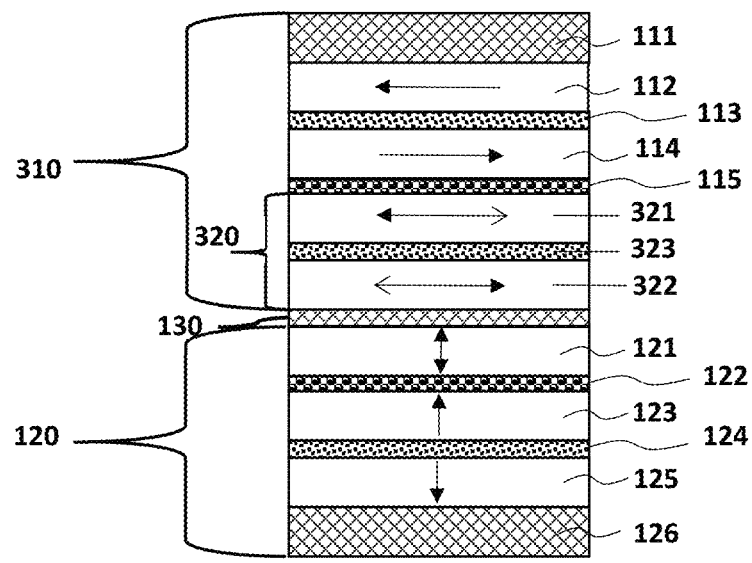
FIG. 3($a$) and FIG. 3($b$) are schematic diagrams of a cross-sectional view of the third embodiment of H-STT-MRAM device and an in-plane STT-MRAM having a SAF FL structure, respectively, where the cross-section is taken from the middle of the cell and perpendicular to the device substrate surface.
Figure 3B:
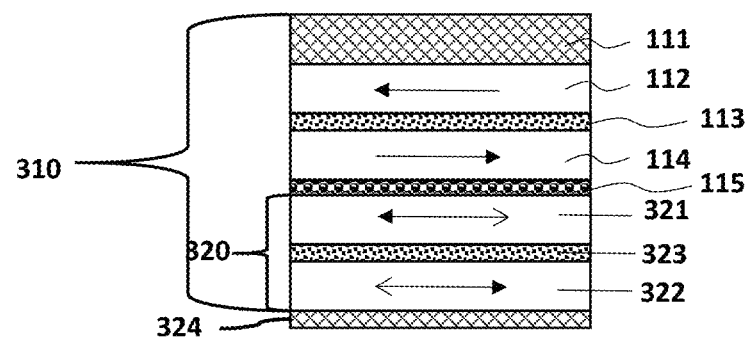

FIG. 3(*a*) and FIG. 3(*b*) show a third embodiment using a SAF free layer structure to replace the FL in the ima-MTJ stack and the FL in the in-plane magnetic anisotropy STT-MRAM device, respectively, to relieve the 60 nm size limitation and size down to sub-10 nm device for increasing areal storage.

As shown in FIG. 3(*a*), a H-STT-MRAM device 300 includes a T-FL pma-MTJ stack 120 and a B-FL ima-MTJ stack 310 separated with each other by a nonmagnetic spacer 130. The B-FL ima MTJ stack 310 includes a SAF FL structure 320. Compared to the H-STT-MRAM 100 as shown in FIG. 1(*a*), the H-SST-MRAM 300 replaces FL 116 in the top ima-MTJ 110 with a SAF FL structure 320 that includes a free layer 321 disposed directly under the MgO tunneling barrier 115, a free layer 322 separated from the free layer 321 with a Ru layer 323 to form an antiferromagnetic coupling between the free layer 321 and the free layer 322 through the Ru layer 323 at its antiferromagnetic peak thickness.

FIG. 3(*b*) shows an in-plane STT-MRAM device having a SAF FL structure design, such as the B-FL ima-MTJ 310 from the H_STT-MRAM 300 in FIG. 3(*a*) in which the nonmagnetic spacer 130 replaced with a nonmagnetic cap layer 324. Due to a strongly AFM coupling of the FL 321 and FL 322 through the Ru spacer 323 in the SAF FL structure 320, the memory cell in the ima-STT-MRAM having a SAF FL structure may relax the 60 nm limitation and size down to sub-10 nm size for high areal storage density application in high performance computing, mobile devices and other memory devices.

Figure 4:
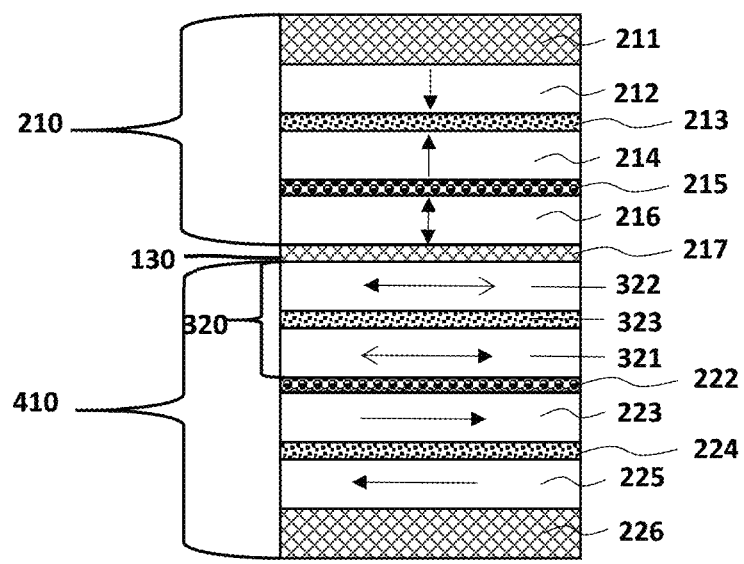
FIG. 4 is a schematic diagram of a cross-sectional view of the fourth embodiment of H-STT-MRAM device, where the cross-section is taken from the middle of the cell and perpendicular to the device substrate surface.

FIG. 4 illustrates the fourth embodiment of a H-STT-MRAM device 400 including a B-FL pma-MTJ stack 210 and a T-FL ima-MTJ stack 410 separated by a nonmagnetic spacer 130. The T-FL ima-MTJ stack 410 includes a SAL FL structure 320. Compared with the H-STT MRAM 200 as shown in FIG. 2, the H-STT MRAM 400 replaces the FL 221 in the T-FL ima-MTJ 220 with a SAF FL structure 320 that includes the free layer 321 disposed directly on the MgO tunneling barrier 222 and the free layer 322 separated from FL 321 with a Ru layer 323 to form a antiferromagnetic coupling between the FL 321 and the FL 322 through the Ru layer 323 at its antiferromagnetic peak thickness. Similarly, the memory size of the H-STT-MRAM 400 may also relax the single FL in-plane MTJ size limitation of about 60 nm and size down to sub-10 nm for high areal density storage due to a stable SAL free layer structure in the ima-MTJ stack.

FIGS. 5(*a*) to 5(*d*) illustrates the writing and reading of a H-STT-MRAM 300 with the ima-MTJ stack being relatively soft, that is, easy to write. A two-step writing method is provided to obtain four resistance states for a 2-bit storage to fully use the capability of the H-STT-MRAM device 300 for further increasing the storage capability. In a saturate writing, the H-STT-MRAM devices as proposed may preferably be written with a maximum resistance and a minimum resistance in the ima-MTJ stack and the pma-MTJ stack, respectively, no matter how the saturate writing currents and current pulses flow along bottom-up direction or top-down direction are. The two resistance states of $(R_{ima}^{min}+R_{pma}^{max})$ and $(R_{ima}^{max}+R_{pma}^{min})$ are obtained in the saturate writing. In order to make the $(R_{ima}^{min}+R_{pma}^{max})$ and $(R_{ima}^{max}+R_{pma}^{min})$ represent two resistance states, the ima-MTJ stack and the pma-MTJ stack in a H-STT-MRAM device have a different TMR effect and the ima-MTJ stack and the pma-MTJ stack can meet this requirement naturally because they have different magnetic properties, including TMR even in their optimum states. A two-step writing method is proposed to obtain two additional resistance states of $(R_{ima}^{min}+R_{pma}^{min})$ and $(R_{ima}^{max}+R_{pma}^{max})$, such that four total resistance states can make the H-STT-MRAM a 2-bit memory device for further increasing the storage capability.

FIG. 5(*a*) shows a spin transfer torque writing process after passing saturate currents and current pulses flowing top-down through the H-STT-MRAM 300 stack. After passing the writing currents and current pulses from the B-FL ima-MTJ 310 to the T-FL pma-MTJ 120, the magnetisations in the FL 121 of the pma-MTJ 120 is rotated parallel to the magnetisation direction in PL 123 under both a normal spin torque transfer from the RL 123 and an additional spin torque transfer perpendicular to the normal spin transfer torque from the FL 322 of the B-FL image MTJ 310. This leads to a minimum resistance in the pma-MTJ stack 120. Meanwhile, the magnetisations in the FL 322 is also subject to an opposite additional spin torque transfer from the FL 121 based on the Newton's third law and transfer this additional STT to the FL 321 through the strong AFM coupling of FL 322 and FL 321 to assist FL 321 writing while the FL 321 will be subject to a normal spin transfer torque from the RL 114 to align its magnetisation antiparallel to the magnetisation in RL 114. Therefore, magnetisations of FL 321 will also be rotated by a normal spine transfer from RL 114 and an additional spin transfer torque perpendicular to the normal spin transfer torque from FL 121 though the nonmagnetic space 130 and the FL 323. The SAF FL structure 320 can also be considered as a whole structure under a normal spin transfer torque from RL 114 and an additional spine transfer torque perpendicular to the normal spin transfer torque from the FL 121 through the nonmagnetic space 130 to align the FL 321 magnetisations in SAF FL structure antiparallel to the magnetisations in the RL 114. Therefore, a top-down writing currents and current pulses will result in a minimum resistance in the T-FL pma-MTJ stack and a maximum resistance in the B-FL ima-MTJ stack; and obtain a resistance state of ($R_{pma}^{min}$, $R_{ima}^{max}$) having a total reading resistance of ($R_{pma}^{min}+R_{ima}^{max}$).

FIG. 5(b) shows the case of a bottom-up writing current flowing through the H-STT-MRAM stack 300. Similar to the top-down writing case, an additional spin transfer torque having same amplitude but opposite direction, perpendicular to its normal spin transfer torque, will act on the two free layers, directly on and directly under the nonmagnetic space in the B-FL ima-MTJ and T-FL pma-MTJ, respectively. A minimum and a maximum resistance are obtained in the B-FL ima-MTJ and T-FL pma-MTJ and obtain a resistance state of ($R_{pma}^{max}$, $R_{ima}^{min}$) having a total reading resistance of ($R_{pma}^{max}+R_{ima}^{min}$).

Not much attention has been paid to a dual STT-MRAM for being unable to obtain maximum or minimum resistance previously. However, as discussed above, the different magnetic properties obtained in the ima-MTJ stack and the pma-MTJ stack and the different values of ($R_{pma}^{min}+R_{ima}^{max}$) and ($R_{pma}^{max}+R_{ima}^{min}$) may represent two different memory states. Moreover, two maximum and minimum resistance states of ($R_{pma}^{max}+R_{ima}^{max}$) and ($R_{pma}^{min}+R_{ima}^{min}$) may also be obtained in FIG. 5(c) and FIG. 5(d), respectively, using the two-step STT writing method proposed in this disclosure. The four resistance states of ($R_{pma}^{min}+R_{ima}^{max}$); ($R_{pma}^{max}+R_{ima}^{min}$); ($R_{pma}^{max}+R_{ima}^{max}$); and ($R_{pma}^{min}+R_{ima}^{min}$) make the H-STT-MRAM a 2-bit storage memory device to further increase the storage capability.

The two-step spin transfer torque writing method uses a second step writing STT currents and current pulses having an opposite direction and a relatively small amplitude on the saturation writing state obtained in the first step writing in order to just reverse the FL magnetisations in the soft (relatively easy writing) MTJ stack to obtain two maximum or two minimum resistance states in both T-FL and B-FL MTJ stacks, respectively. After applying a second-step small bottom-up writing currents and current pulses on the saturated writing state of ($R_{pma}^{min},R_{ima}^{max}$) in FIG. 5(a), the magnetisations of the FL 321 and the magnetisation of the FL 322 of the B-FL ima-MTJ can be revered to parallel and antiparallel to the RL magnetisation direction, respectively, while still under two spin transfer torques; but the magnetisation of the FL 121 in the T-FL pma-MTJ 120 is kept unchanged, shown in FIG. 5(c), to obtain two maximum resistance state of ($R_{pma}^{max},R_{ima}^{max}$) which has total reading resistance of ($R_{pma}^{max}+R_{ima}^{max}$). Similarly, a second step small top-down writing currents and current pulses can be applied on the saturated writing state of ($R_{pma}^{max},R_{ima}^{max}$) in FIG. 5(b) where the magnetisation of the FL 321 and magnetisations of the FL 322 of the B-FL ima-MTJ is just revered to parallel and antiparallel to the RL magnetisation direction, respectively, while also under two spin transfer torques. But the magnetisation of the FL 121 in T-FL pma-MTJ 120 is still kept unchanged as shown in FIG. 5(d) to obtain two minimum resistance state of ($R_{pma}^{min}$, $R_{ima}^{min}$) which has a total reading resistance of ($R_{pma}^{min}+R_{ima}^{max}$). Therefore, a 2-bit STT storage can be realized in the disclosed H-STT-MRAM device and the additional spin transfer torque, perpendicular to the normal spin transfer torque, to assistant writing will be a further advantage in this state of art design.

FIG. 6(a) to FIG. 6(d) show a 2-bit STT writing processes of the H-STT-MRAM 300 having a relatively soft (easy writing) pma-MTJ stack using the proposed two-step writing method. Similar to those in FIG. 5(a) and FIG. 5(b), as shown in FIG. 6(a) and FIG. 6(d), the saturated STT writing aligns the magnetisations in both ima-MTJ FL and pma-MTJ FL to obtain a ($R_{pma}^{min}$, $R_{ima}^{max}$) state having a total resistance of ($R_{pma}^{min}+R_{ima}^{max}$) in FIG. 6(a) after passing top-down saturated writing currents and current pulses. As shown in FIG. 6(b), the saturated STT writing obtains a ($R_{pma}^{max}$, $R_{ima}^{min}$) state having a total resistance of ($R_{pma}^{max}+R_{ima}^{min}$) after passing bottom-up saturated writing currents and current pulses. The second step writing is to use a reversed and relatively small amplitude writing currents and current pulses to just reverse the FL in the soft pma-TMJ stack; and as shown in FIG. 6(c), and then a ($R_{pma}^{max}$, $R_{ima}^{max}$) state having a total resistance of ($R_{pma}^{max}+R_{ima}^{max}$) as shown in FIG. 6(c) is obtained after passing a second step bottom-up reversed relatively small amplitude writing currents and current pulses on the ($R_{pma}^{min}+R_{ima}^{max}$) in FIG. 6(a) to reverse the magnetisations of FL in the soft pma-MTJ stack from $R_{pma}^{min}$ to $R_{pma}^{max}$ under the two spin transfer torques while $R_{ima}^{max}$ state in the ima-MTJ is kept unchanged. Similarly, a ($R_{pma}^{min}$, $R_{ima}^{min}$) state having a total resistance of ($R_{pma}^{min}+R_{ima}^{min}$) shown in FIG. 6(d) is obtained after passing a second step top-down reversed relatively small amplitude writing currents and current pulses on the ($R_{pma}^{max}+R_{ima}^{min}$) in FIG. 6(b) to reverse the magnetisations of FL in the soft pma-MTJ stack from $R_{pma}^{max}$ to $R_{pma}^{min}$ under two spin transfer torques while $R_{ima}^{min}$ state of the ima-MTJ is kept unchanged. Therefore, four resistance states, including ($R_{pma}^{min}+R_{ima}^{max}$); ($R_{pma}^{max}+R_{ima}^{min}$); ($R_{pma}^{max}+R_{ima}^{max}$); and ($R_{pma}^{min}+R_{ima}^{min}$) can also be obtained in the H-STT-MRAM device having relative soft pma-MTJ stack for 2-bit storage.

Figure 7C:
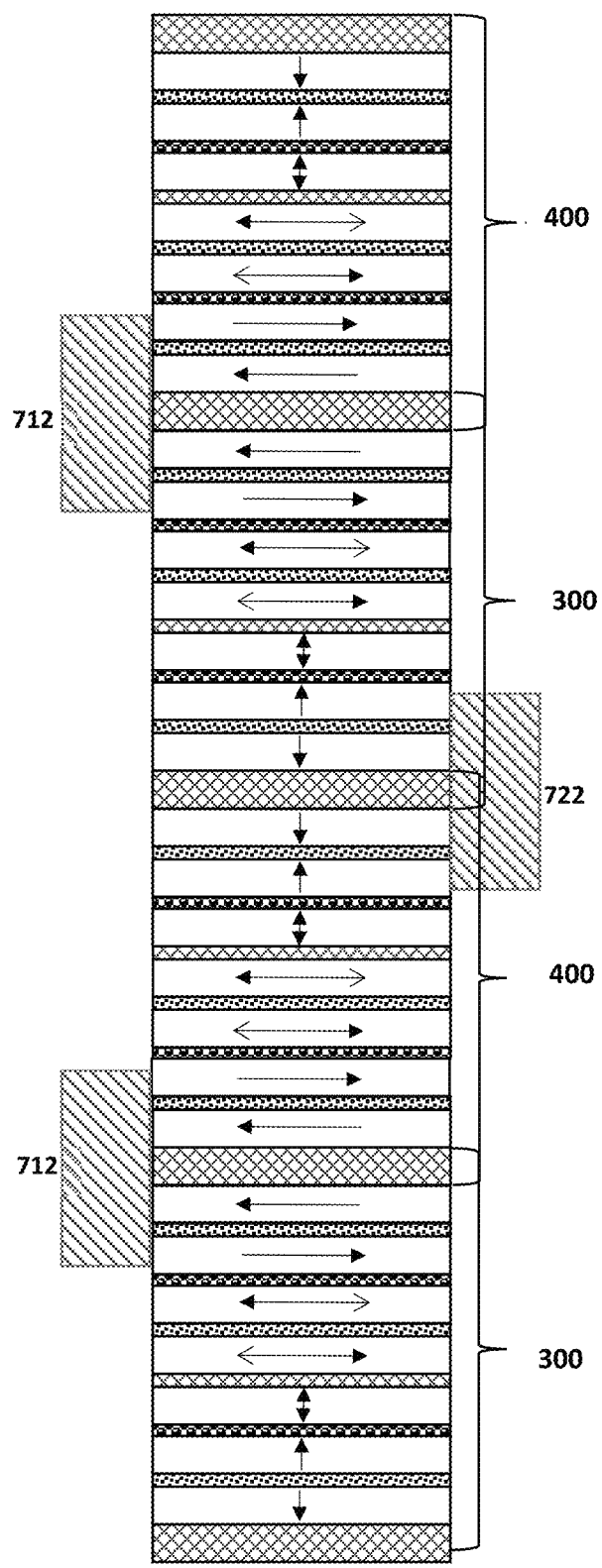
FIG. 7($a$) to FIG. 7($c$) show schematic diagrams of cross-sectional views of the 4-bit H-STT-MRAM device, the 6-bit H-STT-MRAM device and the 1-byte H-STT-MRAM device, respectively, where each cross-section is taken perpendicular to the device substrate.

The 2-bit H-STT-MRAM device can be further extended to n-bit H-STT-MRAM device for increasing areal density. FIG. 7(a) to FIG. 7(c) illustrate 4-bit, 6-bit, and 8-bit H-STT-MRAM device designs, respectively. A 4-bit H-STT-MRAM device formed by stacking of the 2-bit H-STT-MRAM device 400 on the 2-bit H-STT-MRAM device 300 or in a reversed order in order to share a same AFM pinning layer by the two adjacent pma-MTJs or the two adjacent ima-MTJs. FIG. 7(a) shows a 4-bit H-STT-MRAM device 710 formed by stacking the 2-bit H-STT-MRAM 300 stacked on the 2-bit H-STT-MRAM 400 where the B-FL ima-MTJ in 400 and the T-FL ima-MTJ in 300 share one AFM pinning layer 714 and a side contact of 712 extends within a range from the RL stack of the B-FL ima-MTJ in the H-STT-MRAM 400 to the RL stack of the T-FL ima-MTJ in the H-STT-MRAM 300. The contact 712 is used in STT writing and TMR reading for realising a 4-bit storage. In order to prevent from breaking-down the transistor by large currents and current pulses going through the whole stack and also writing in individual 2-bit H-STT-MRAM stack, the bottom electrode contact and the contact 712 can be used to write the 2-bit H-STT-MRAM 400 and the top electrode contact and 712 can be used to write the 2-bit H-STT-MRAM 300. Because the reading current is much smaller than the writing currents and current pulses, there is no much risk to break down the transistor as long as the reading voltage is smaller than the transistor broken-down voltage. By using the proposed two step writing method on 300 and 400, respectively, the 4-bit storage of 16 resistance states {(00)(00)}; {(11)(11)}; {(00)(01)}; {(00)(10)}; {(01)(00)}; {(10)(00)}; {(00)(11)}; {(11)(00)}; {(10)(10)}; {(01)(10)}; {(01)(01)}; {(10)(01)}; {(01)(11)}; {(10)(11)}; {(10)(01)}; {(11)(10)} where "1" represents a maximum resistance state and "0" represents a minimum resistance state in the order of {($R^1_{pma}R^1_{ima}$)($R^2_{ima}R^2_{pma}$)} and the $R^i$ represents the $i^{th}$ 2-bit H-STT-MRAM stack. The 2-bit stored in 300 is obtained as $R^1=(R^1_{pma}+R^1_{ima})$ firstly by passing through a reading current from transistor and the first contact 712, then the total resistances $R^1+R^2=(R^1_{pma}+R^1_{ima})+(R^2_{pma}+R^2_{ima})$ in the device 700 formed by 300 and 400 is obtained by passing through a reading current from transistor and the top bit line to work out the storage resistance of $R^2$ in 400 by taken out the resistance of $R^1$ in 300, $R^2=(R^1_{pma}+R^1_{ima})+(R^2_{pma}+R^2_{ima})-R^1=(R^2_{pma}+R^2_{ima})$. FIG. 7b shows a 6-bit H-STT-MRAM device 720 formed by stacking the 2-bit H-STT-MRAM device 300 on the 4-bit H-STT-MRAM device 710 where the T-FL pma-MTJ in the 300 and the B-FL pma-MTJ in 710 shares a same AFM pinning layer 724 as well. A contact 722 within a range from the RL stack of the B-FL pma-MTJ in 710 to the RL stack of the T-FL pma-MTJ in the 300 in additional to the 712. Similarly, the writing of the further 2-bit H-STT-MRAM can be obtained by passing the writing current from the device top electrode and the contact 722. The reading can be done in a similar way in the 4-bit H-STT-MRAM device. FIG. 7c shows a 1-byte H-STT-MRAM device 730 formed by stacking up two 4-bit H-STT-MRAM 710 where the B-FL pma-MTJ in the low 710 and the the pma-MTJ in the top 710 shares a same AFM layer and a contact 722 in 720 can be still used for writing and total of 32 resistance states can be written and reading out similar to that in a 4-bit H-STT-MRAM 710.

In a similar way, a 4n-bit H-STT-MRAM device having one transistor can be obtained by stacking up total of n 4-bit H-STT-MRAM devices having a total of (2n–1) side contacts between two adjacent RLs in the two adjacent ima-MTJs or two adjacent pma-MTJs. Any (4n–2)-bit H-STT-MRAM device can be obtained by taking away a 2-bit H-STT-MRAM stack from a 4n-bit H-STT-MRAM device if need. The main purpose of high-bit H-STT-MRAM device is to fully use the capability of one transistor in the condition of that the reading current going through the transistor and the high-bit H-STT-RAM is not large enough to break-down the transistor barrier. In order to read out the information exactly stored in each MTJ of a 4n-bit H-STT-MRAM stack, the reading current needs to go through from the transistor to the first side contact for reading out the state of $R^1=(R^1_{ima}+R^1_{pma})$, then to the second contact for reading out state of $R^1+R^2=(R^1_{ima}+R^1_{pma}+R^2_{pma}+R^2_{ima})$ to obtain $R^2=(R^2_{ima}+R^2_{pma})$ after taken the known $(R^1_{ima}+R^1_{pma})$, . . . then to the top bit line for reading out the total resistance of the 4n-bit H-STT-MRAM device, equal to $\Sigma_{i=1}^{2n}R^i$ in order to obtain $R^{2n}=\Sigma_{i=1}^{2n}R^1-\Sigma_{i=1}^{2n-1}R^i=(R^{2n}_{ima}+R^{2n}_{pma})$ after taken the known $R^{2n-1}=\Sigma_{i=1}^{2n-1}R^i$ obtained from the reading through the transistor to the (2n–1) side contact. A constant reading current would be a good choice to avoid broken-down the transistor barrier if the constant current is well below the transistor barrier broken-down critical current. The writing process on any middle 2-bit H-STT-MRAM can be completed by going through the two adjacent side contacts to avoid the large writing currents and current pulses passing the transistor except the one bottom 2-bit H-STT-MRAM stack, just on the transistor. The side contact can further comprising a contact layer between two adjacent 2-bit H-STT-MRAM devices where two devices cannot share a same AFM anymore and the stacking of 2-bit H-STT-MRAMs can be arranged in other order, but a regular stacking up order is preferred to determine the individual pma-MTJ resistance state and ima-MTJ resistance state in each 2-bit H-STT-MRAM while writing and reading.

A two dimensional (2D) array and even a three dimensional (3D) array of high-bit H-STT-MRAM devices can be made for high performance computing, mobile devices and information storage devices. In the 2D array case, a high-bit H-STT-MRAM unit is isolated from its adjacent H-STT-MRAM units although the side contacts in the same level can share public circuits on the same level for writing and reading. The 3D array case is just the stacking up 2D array of high-bit H-STT-MRAM devices including its transistor to share a same substrate and increase areal storage density.

The embodiments of H-STT-MRAM devices mentioned above are illustrated only to achieve the features and advantages of the disclosure, but not limiting and may not be drawn in scale. This disclosure is intended to include any and all subsequent adaptions, combined or variations of various embodiments that may be utilized and derived after this disclosure, but without departing from the spirit and scope of this disclosure.

What is claim is:

1. A memory device, comprising:
   a first ma-MTJ having a first free layer disposed at one end thereof,
   a second ma-MTJ having a second free layer disposed at one end thereof, the first and second ma-MTJs being stacked with other with the first free layer facing the second free layer,
   a first tunneling barrier layer being sandwiched between the first free layer and the second free layer, and
   a magnetic anisotropy direction of the first ma-MTJ is perpendicular to a magnetic anisotropy direction of the second ma-MTJ and a magnetisation direction of the first free layer is perpendicular to a magnetisation direction of the second free layer.

2. The memory device of claim 1, wherein the first free layer and the second free layer are immediately adjacent to the two opposite sides of the first tunneling barrier layer.

3. The memory device of claim 1, wherein the first tunneling barrier layer includes a Cu layer.

4. The memory device of claim 1, wherein the first tunneling barrier layer includes at least MgO, AlO, TiO, or another dielectric material.

5. The memory device of claim 1, wherein each of the first and the second ma-MTJs further comprises:
   a tunneling barrier;
   a reference layer;
   a metallic spacer layer;
   a pinned layer; and
   an antiferromagnetic pinning layer arranged in sequence from the first and the second free layer, respectively.

6. The memory device of claim 5, wherein the reference stack from the reference layer to the antiferromagnetic pinning layer of the second ma-MTJ further comprising one of:
   a permanent perpendicular magnetic anisotropy (pma) magnetic layer comprising hcp(002) Co alloy or L10 alloy; and
   an synthetic antiferromagnetic stack comprising two permanent perpendicular magnetic anisotropy layers separated from each other by a metallic spacer layer.

7. The memory device of claim 1, wherein the first ma-MTJ includes a first in-plane magnetic anisotropy ma-MTJ (ima-MTJ) and the second ma-MTJ includes a first perpendicular magnetic anisotropy ma-MTJ (pma-MTJ).

8. The memory device of claim 7, wherein the first ima-MTJ further comprising a metallic spacer layer, and a third free layer having arranged in sequence between the first free layer and the first tunneling barrier layer.

9. The memory device of claim 8, wherein the first ima-MTJ, the first tunneling barrier layer, and the first pma-MTJ are arranged in a top-down sequence.

10. The memory device of claim 8, wherein the pma-MTJ, the tunneling barrier layer, and the ima-MTJ are arranged in a top-down sequence.

11. The memory device of claim 10, further comprising:
a second ima-MTJ;
a second tunneling barrier layer; and
a second pma MTJ arranged in a top-down sequence from the first ima-MTJ,
wherein the first ima-MTJ and the second ima-MTJ share a common antiferromagnetic pinning layer therebetween.

12. The memory device of claim 11, wherein the second ima-MTJ comprises a fourth free layer, a metallic spacer layer, and a fifth free layer arranged in a top-down sequence between the common antiferromagnetic pinning layer and the second pma-MTJ.

13. The memory device of claim 11, wherein the second pma-MTJ comprises a sixth free layer immediately adjacent to the second tunneling barrier layer.

14. The memory device of claim 11, further comprising a first contact at a side surface of the memory device and the first contact extending within a range from a reference layer of the first ima-MTJ to a reference layer of the second ima-MTJ.

15. The memory device of claim 11, further comprising a third ima-MTJ, a third tunneling barrier layer, and a third pma-TMJ arranged in a top-down sequence on top of the first pma-MTJ.

16. The memory device of claim 15, wherein the third ima-MTJ comprises a seventh free layer a metallic spacer of layer, and an eighth free layer arranged in sequence on top of the third tunneling barrier layer.

17. The memory device of claim 15, wherein:
the third pma-MTJ comprises a ninth free layer immediately adjacent to the third tunneling barrier layer; and
the third pma-MTJ and the first pma-MTJ share a common antiferromagnetic pinning layer.

18. The memory device of claim 15, further comprising:
a first contact at a side surface of the memory device and the first contact extending within a range from a reference layer of the first ima-MTJ to a reference layer of the second ima-MTJ
a second contact at a side surface of the memory device and the second contact extends within a range from a reference layer of the third pma MTJ to a reference layer of the first pma MTJ.

19. The memory device of claim 18, further comprising a fourth pma-MTJ, a fourth tunneling barrier layer, and a fourth ima-TMJ arranged in a top-down sequence under the second pma-MTJ on top of the third ima-MTJ.

20. The memory device of claim 19, wherein:
the fourth pma-MTJ comprises a tenth free layer immediately adjacent to the fourth tunneling barrier layer;
the fourth ima-MTJ comprises an eleventh free layer, a metallic spacer layer, and a twelfth free layer arranged in a top-down sequence under the fourth tunneling barrier layer; and
a third contact electrode at the side of the memory device and the third contact extends within a range from a reference layer of the fourth ima-MTJ to a reference layer of a third ima-MTJ, and the third and fourth ima-MTJ share a common antiferromagnetic layer.

* * * * *